United States Patent [19]

Upadhyayula

[11] 4,420,743
[45] Dec. 13, 1983

[54] VOLTAGE COMPARATOR USING UNEQUAL GATE WIDTH FET'S

[75] Inventor: Lakshminarasimha C. Upadhyayula, East Windsor, N.J.

[73] Assignee: RCA Corporation, New York, N.Y.

[21] Appl. No.: 334,257

[22] Filed: Dec. 24, 1981

Related U.S. Application Data

[63] Continuation of Ser. No. 120,333, Feb. 11, 1980, abandoned.

[51] Int. Cl.$^3$ .................... H03K 13/02; H03K 13/175
[52] U.S. Cl. .............................. 340/347 AD; 307/304; 340/347 M
[58] Field of Search ................... 340/347 M, 347 AD; 307/209, 304, 360, 361, 451

[56] References Cited

U.S. PATENT DOCUMENTS

| | | | |
|---|---|---|---|
| 3,504,189 | 3/1970 | McHenry | 307/41 |
| 3,631,528 | 12/1971 | Green | 307/451 X |
| 3,670,180 | 6/1972 | Grossimon et al. | 307/244 |
| 3,775,693 | 11/1973 | Proebsting | 307/304 X |
| 3,975,649 | 8/1976 | Kawagoe et al. | 307/304 |
| 4,000,429 | 12/1976 | Yoshida et al. | 307/246 |
| 4,008,406 | 2/1977 | Kawagoe | 307/304 |
| 4,069,430 | 1/1978 | Masuda | 307/270 |
| 4,072,868 | 2/1978 | De La Moneda et al. | 307/214 |

OTHER PUBLICATIONS

The Engineering Staff of Analog Devices, Inc., Analog-Digital Conversion Handbook, 6/1972, pp. II-52 and II-53.
Hnatek, A User's Handbook of D/A and A/C Converters, John Wiley & Sons, 1976, pp. 20 and 21.

*Primary Examiner*—T. J. Sloyan
*Attorney, Agent, or Firm*—Joseph S. Tripoli; Christopher L. Maginniss

[57] ABSTRACT

The threshold comparator includes a switching FET including a gate electrode and a load FET connected in series across a source of potential where the load FET is configured to provide a saturation current less than that of the switching FET with a first input level to the gate electrode and provide a saturation current greater than that of the switching FET with a second input level to the gate electrode. The output voltage of the switching FET changes value abruptly when the input level at its gate electrode attains the second input level where the saturation current in the switching FET is less than the saturation current of the load FET.

3 Claims, 7 Drawing Figures

VOLTAGE COMPARATOR USING UNEQUAL GATE WIDTH FET'S

This is a continuation of application Ser. No. 120,333, filed Feb. 11, 1980, now abandoned.

The present invention relates to threshold comparators and more particularly to threshold comparators using field-effect transistors.

The military systems of the 1980's will require multi-gigabit rate LSI logic circuits for real-time signal processing. The limiting frequency rate of a signal processing system using such circuits is determined by the speed of propogation through the individual components. The critical components in a system of this type are the analog-to-digital (A/D) converters, voltage level shifters, latches and encoder circuits.

In order to digitize signals for processing it will be necessary to develop fast A/D converters. High speed A/D converters will find many applications including digital microwave receivers and radar systems for signature identification. The A/D converter with the highest speed is one in which the threshold comparators of the A/D converter are combined in parallel with a common input.

The recently developed technology of fabricating field-effect transistors (FETs) on gallium arsenide (GaAs) substrates has brought about a family of electronic circuits with very fast switching speeds yet low power dissipation. The major advantage of GaAs substrates over silicon substrates for multi-gigabit rate logic applications stems from the higher electron mobility and semi-insulating properties. GaAs FETs at room temperature have demonstrated switching speeds of 32 to 60 picoseconds and power amplification of signals with frequency up to 37 gigahertz. The benefit of the fast switching speed of the GaAs FET-based technology has been put to use in the development of high speed logic circuits, including level shifters, latches and encoders. However, until now, threshold comparators operating at gigahertz rates have not been known.

A typical threshold comparator in the prior art consists of an extremely high gain differential amplifier with one input set to a predetermined reference voltage by means of a resistor divider network. The selection of the ratio of the resistor values sets the value of threshold voltage for the comparator. When the voltage at the other amplifier input exceeds the threshold voltage, the output of the amplifier assumes a voltage approximating either the positive or the negative bias applied to the amplifier. When the voltage on that input is less than the threshold voltage, the output of the amplifier assumes the other bias level. As the voltage on the input signal passes from a value less than the threshold voltage to one greater than the threshold voltage, the gain of the amplifier insures that the slope of the transition on the output is extremely steep, that is, the output switches with a minimum amount of time delay from the low state to the high state. The drawbacks of this type of comparator, especially in view of the requirements enunciated above, is the limited frequency range of the amplifier. Operation of differential amplifiers to switch coherently in response to signals occurring at a rate above 300–400 MHz is not known, whereas GaAs FET devices are presently operating to switch coherently in response to signals occurring at frequencies two orders of magnitude higher. It is clear that a need exists for a comparator with speed of operation comparable to GaAs FET devices.

In accordance with an apparatus embodying the present invention for detecting the amplitude of an input signal relative to a threshold, two current conducting devices are connected in series across a source of potential. The first device exhibits a load current which establishes the threshold of the apparatus. The second device responds to a range of input signals to its control electrode by exhibiting a corresponding range of saturation current levels, above and below the load current of the first device. When the input signal is applied to the control electrode and that signal changes value from one which produces a saturation current above the load current to one which produces a saturation current below the load current, the output level across the second device changes.

Figure 1:
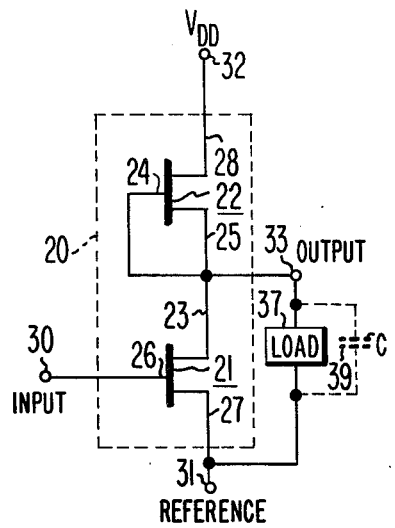
FIG. 1 is a schematic drawing of a threshold comparator embodying the present invention.

The basic unit of an analog-to-digital converter embodying the present invention is the comparator 20 as shown in FIG. 1. Each comparator 20 comprises for example, two n-channel gallium arsenide (GaAs) MEtal Semiconductor FETs (MESFETs); one FET 21 acts as a switch and the other FET 22 acts as a load. These FETs are connected in series across a source of potential. The drain electrode 23 of the switching FET 21 is connected to the gate electrode 24 and the source electrode 25 of the load FET 22. Analog signals at an input terminal 30 are applied to the comparator 20 at the gate electrode 26 of the switching FET 21. In the configuration of the present embodiment, the source electrode 27 of the switching FET 21 is connected to a reference or ground potential at reference terminal 31 and the drain electrode 28 of the load FET 22 is connected to a more positive voltage source $V_{DD}$ at power supply terminal 32. The output state of the comparator 20 is indicated by the voltage provided at the output terminal 33, which is connected to the drain electrode 23 of the switching FET 21 and the gate and source of FET 22. A load circuit 37 is coupled between terminal 33 and ground or reference terminal 31. This load circuit may provide voltage level shifting. The load circuit 37 presents a load capacity which in combination with the inherent capacity of the comparator FETs is represented by capacitance 39 as shown in dashed lines.

Figure 2:
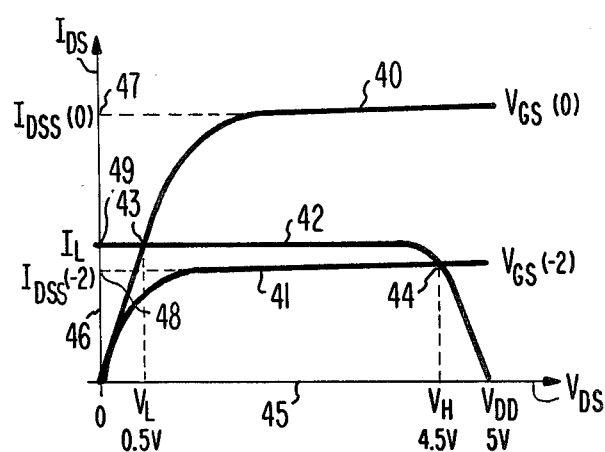
FIG. 2 and FIG. 3 are I-V plots of the FET output characteristics with an FET load line superimposed useful for explaining the operation of the circuit of FIG. 1.

The output characteristics of a typical n-channel FET type device such as used for switching FET 21 in FIG. 1 are shown in FIG. 2. The drain-to-source current ($I_{DS}$), which flows through a single FET device, is plotted on the ordinate 46 and the drain-to-source voltage ($V_{DS}$) across this FET device is plotted on the abscissa 45. The supply voltage, $V_{DD}$, for the FETs in this example is 5 volts. The $V_{GS}(0)$ curve 40 represents for a typical n-channel FET such as switching FET 21 the relationship between drain-to-source current and drain-to-source voltage for an input voltage at the gate equal to the source ($V_{GS}=0$ volts). It should be noted for this condition that as $V_{DS}$ increases, $I_{DS}$ also increases (see curve 40) until it reaches a value of $I_{DSS}(0)$ shown on the $I_{DS}$ ordinate axis 46 at point 47. This is the saturation current level for an input voltage level of 0 volts. Once a saturation current level is reached, any increase in the drain-to-source voltage will cause little or no increase in current flow. The $V_{GS}(-2)$ curve 41 represents the relationship between $I_{DS}$ and $V_{DS}$ where the potential at the gate electrode of switching FET 21 is 2 volts less than the potential at the source electrode ($V_{GS}=-2$ volts). The saturation current level $I_{DSS}(-2)$ (at point 48 on the ordinate 46) illustrated by curve 41 of FIG. 2 is less than the saturation current level illustrated by $V_{GS}(0)$ curve 40.

Superimposed on the plot of the switching FET 21 output characteristics in FIG. 2 is a curve 42 which illustrates both the load current and load line of the load FET 22. A curve 42 is a plot of the DC output characteristics of the load FET 22 for $V_{GS}(0)$ where the abscissa 45, instead of representing the drain-to-source voltage, as is the normal manner for output characteristics, represents the voltage at the source electrode 25 with respect to the reference node 31. The curve 42 is plotted for $V_{GS}$ at 0 volts because, in the embodiment depicted in FIG. 1, the gate electrode 24 and the source electrode 25 of the load FET 22 are directly connected.

The portions of the output characteristic curves 40, 41 and 42 in FIG. 2 which are essentially parallel to the abscissa 45 represent the range of voltages over which the FETs are in saturation, i.e., virtually no increase in the amount of current can be made to flow between drain and source. The amplitude level of the saturation current, $I_{DDS}$, can be determined for each of the three curves. The $V_{GS}(0)$ curve 40 illustrates the saturation of the switching FET 21 at the current value of $I_{DSS}(0)$ (point 47 on ordinate 46) for zero input at terminal 30, and the $V_{GS}(-2)$ curve 41 illustrates the saturation of the FET 21 at a lesser current value of $I_{DSS}(-2)$ (point 48 on ordinate 46) for $-2$ volt input at terminal 30. The curve 42 of the load FET 22 is parallel to the abscissa where it intercepts the current ordinate 46 at a value $I_L$ at point 49, the saturation current for load FET 22. As will become evident in a later discussion, it is the value of load current $I_L$ that establishes the threshold of the comparator and the transition of the output voltage from a low to a high level at terminal 33 takes place when the switching FET 21 saturation current changes from a value above that of the load current to a value below the load current. For the operation of the comparator of FIG. 1 the saturation current level of the load FET 22 should be between the saturation current $I_{DSS}(0)$ and $I_{DSS}(-2)$ for the output terminal 33 to change output levels in response to changes in the voltage level at the input terminal 30 between 0 and $-2$ volts.

One inherent limitation in an FET of this type is the typical drain-to-source voltage drop of approximately one-half volt. The effect of this limitation is that the voltage drop across the switching FET 21 limits the lowest value at the output terminal 33 to about one-half volt above the reference, or about 0.5 volts, and the voltage drop across the load FET 22 limits the highest value at the output terminal 33 to about one-half volt below the supply voltage, or about 4.5 volts.

A second, and more obvious, limitation of the circuit is the restriction that the current through the series combination of FETs may not exceed the lesser of the two saturation currents. Hence, the current flow through the comparator 20 will be determined by the point on the graph in FIG. 2 where the $V_{GS}$ curve corresponding to the voltage on the input terminal 30 crosses the load line curve 42 of the load FET 22. From that intersection the voltage on the output terminal 30 may be determined.

The net effect of the aforementioned two limitations is to confine the operation of the comparator 20, as measured by the potential on the output terminal 33, to the load FET 22 load curve 42 on FIG. 2 on or between the points 43 and 44, which represent the points on that curve 0.5 volts from the reference and power supply potentials, respectively. In this example, with the reference at 0 volts and the power supply at 5 volts, the comparator 20 operates on the load curve 42 between a $V_L$ of 0.5 volts and a $V_H$ of 4.5 volts.

In summary, when the potential at the input terminal 30 of the comparator 20 is at 0 volts, which produces a saturation current level greater than the threshold level $I_L$ provided by the load FET 22, the current flow through the load FET 22 limits the current through the series combination causing the potential at the output terminal 33 to be $V_L$. When the potential at the input terminal 30 is at $-2$ volts, which produces a saturation current level less than the threshold level provided by load FET 22, the current flow through the switching FET 21 limits the current through the series combination causing the potential at the output terminal 33 to be $V_H$.

Figure 3:
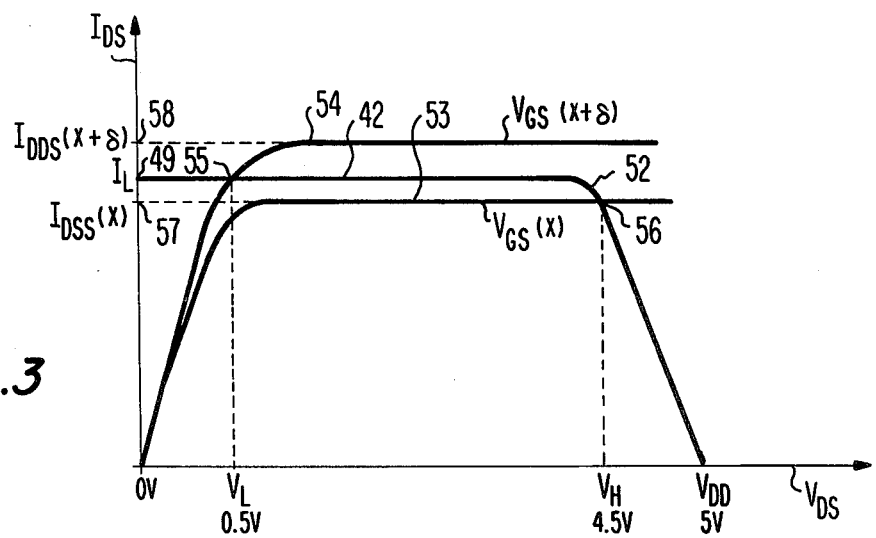

From the preceding discussion it is relatively easy to see that there will exist two values of $V_{GS}$, i.e., the voltage on input terminal 30, with corresponding saturation current levels, one slightly greater and the other slightly less than the saturation current level, $I_L$ (point 49), of the load FET 22, such that, as the voltage at the input terminal 30 varies between the two values of $V_{GS}$, the operating point on the load line curve 42 slides between values approximating $V_L$ and $V_H$ (between 0.5 volts and 4.5 volts for example). This is shown more clearly in FIG. 3 for the circuit of FIG. 1. The output characteristics for the switching FET 21 for a first value of input voltage X is shown by curve 53, the $V_{GS}(X)$ curve. The saturation current level for $V_{GS}$ voltage is $I_{DSS}(X)$ which is represented at point 57 on the ordinate. The load FET 22 saturation current (see curve 42) is at a level $I_L$ (point 49 on the ordinate axis) greater than level $I_{DSS}(X)$ (point 57). The $V_{GS}(X)$ curve 53 intersects the load line curve 42 at point 56 just below the knee 52. A second value of input voltage, $X+\delta$, to the input terminal 30 slightly greater (less negative) than X produces an output with a characteristic curve 54 with a value of saturation current level $I_{DSS}(X+\delta)$ (point 58) slightly greater than $I_L$. This current-voltage curve 54 intersects the load line curve 42 at point 55. As a result of this analysis, it can be seen that a small change in voltage on the input terminal 30, from slightly above the threshold voltage to slightly below the threshold of $I_L$, results in a large voltage swing at the output terminal 33 from $V_L$, the low output level, to $V_H$, the high output.

It follows from the preceding discussion that the output terminal 33 of comparator 20 will change logic state or level when the voltage on the input terminal 30 is such that it elicits a saturation current through the switching FET 21 equal to the saturation current for the load FET 22. Thus, for a given switching FET 21 with a particular set of output characteristics, the output at terminal 33 can be made to change from one logic state to the other at differing input voltages by selecting load FETs 22 with correspondingly different saturation current characteristics. A load FET 22 with a high value of saturation current will cause the output terminal 33 of the comparator 20 to change state for a higher (less negative) input voltage than one with a smaller value of saturation current.

To serve a useful function, a comparator must have a threshold which can be specified to be a particular voltage. In the differential amplifier comparator discussed previously as prior art, that voltage was effectuated by the judicious selection of resistors in the divider network. The comparator of the instant invention, however, is fabricated with the threshold voltage inherent in the combination of FETs, and more particularly to the saturation current levels of the switching and load FETs. The conductivity and saturation current levels of an FET are determined by the width of its gate electrode and the scaling of those electrodes of the switching FET 21 and the load FET 22, in a manner well known in the art, results in a comparator with a preselected value of threshold voltage. Using large-scale integration techniques, for example, the gate electrode may be metalization layers of titanium, platinum and gold, deposited on the substrate using a photolithographic technique. The dimensions of the gate electrodes are determined by the geometry of the mask. Thus, a selectable threshold voltage is designed into each comparator by using the scaling parameter of the ratio of the widths of the gate electrodes.

Figure 4:
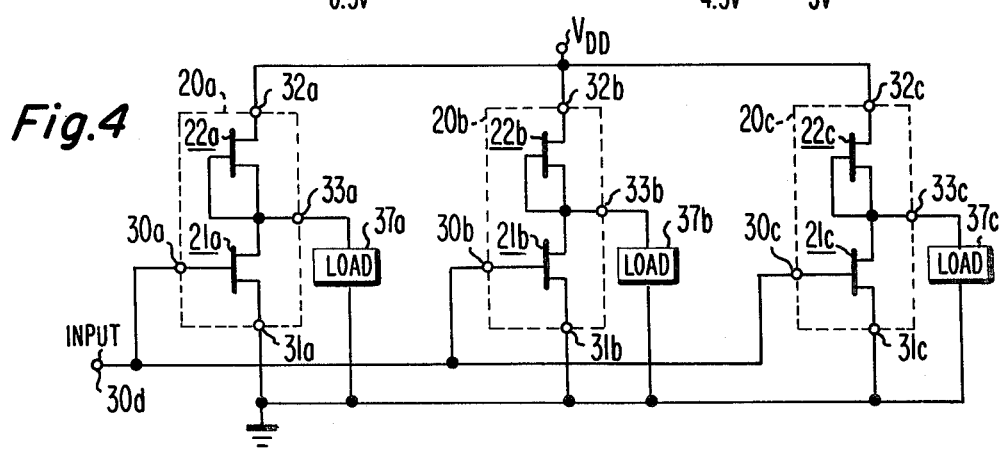
FIG. 4 is an analog-to-digital converter using the voltage comparator of FIG. 1.

If several such comparators 20 each with identical output characteristics of the switching FETs 21 but with different levels of saturation current for each load FET 22 are interconnected at the input terminal 30, the voltage of each output terminal 33 will change from one logic state to the other at a time apart from every other output node 33 as the voltage level at the input terminal 30 increases or decreases. The features engendered in the applicant's invention are demonstrated in one embodiment depicted in FIG. 4. In FIG. 4 three comparators 20a, 20b and 20c, each of a similar circuit to comparator 20 in FIG. 1 but with load FETs 22a, 22b and 22c having different levels of saturation current, are interconnected in parallel combination to form an A/D converter. The reference terminals 31a, 31b and 31c are connected to a common ground terminal, the power supply terminal 32a, 32b and 32c are connected to a common source of power ($V_{DD}$ of 5 volts, for example), the input terminals 30a, 30b and 30c are connected to each other at common input terminal 30d, and the output terminals 33a, 33b and 33c are each coupled to different load circuits 37a, 37b and 37c, respectively. A time-varying analog signal is applied to input terminal 30d.

The switching FETs 21a, 21b and 21c are substantially identical and, for example, are like that in FIG. 1. The load FETs 22a, 22b and 22c have selectively different saturation current levels. The load FET 22a has the lowest saturation current level, load FET 22b has the next lowest saturation current level, and load FET 22c has the highest saturation current level. The relationships between these saturation current levels may be realized by using the photolithographic technique suggested above. A wide gate electrode will reslt in a higher level of saturation current than a narrower gate electrode.

Figure 5:
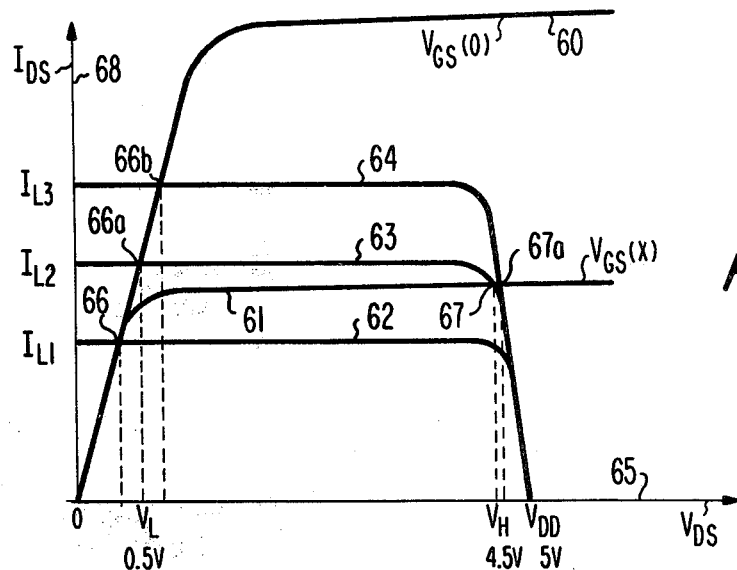
FIG. 5 is an I-V plot of the FET output characteristics with three FET load lines superimposed useful for explaining the operation of the circuit of FIG. 4.

FIG. 5 is a plot of the output characteristics of a switching FET, of a type similar to 21a, 21b and 21c, with three different load line curves 62, 63 and 64 superimposed thereon. As in FIGS. 2 and 3 the source-to-drain current ($I_{DS}$) of the switching FET 21 is plotted on the ordinate 68 and the drain to source voltage ($V_{DS}$) is plotted on the abscissa 65. For the load FETs, the abscissa 65 represents DC output. Curve 60 is the characteristic curve for $V_{GS}$ at 0 volts and curve 61 is the characteristic curve for $V_{GS}$ at voltage X, where X is some negative value of voltage. The three load line curves 62, 63 and 64 on FIG. 5 represent the current-voltage load characteristics presented by load FETs 22a, 22b and 22c, respectively, in the circuit shown in FIG. 4. As can be seen in this figure, the $V_{GS}(0)$ curve 60 intersects the three load line curves 62, 63 and 64 at points 66, 66a and 66b which produce output voltages close to the same value at $V_L$ (0.5 volts for example). This means that when the potential on the input node 30d is at 0 volts, the voltages on the output nodes 33a, 33b and 33c are all low. The voltage X produces a saturation current illustrated by curve 61 that intersects load line curve 62 at point 66 which $V_{DS}$ axis 65 intercept is near $V_L$ and intersects load line curves 63 and 64 at points 67 and 67a which $V_{DS}$ axis 65 intercept is at $V_H$. Therefore, for a potential at the input terminal 30d of X as shown in FIG. 5, the comparator 20a with a load FET 22a exhibiting load line curve 62 provides at its output terminal 33a a low voltage of $V_L$ while comparators 20b and 20c with load FETs 22b and 22c exhibiting load line curves 63 and 64 provide at their output terminals 33b and 33c a high voltage $V_H$.

Figure 6:
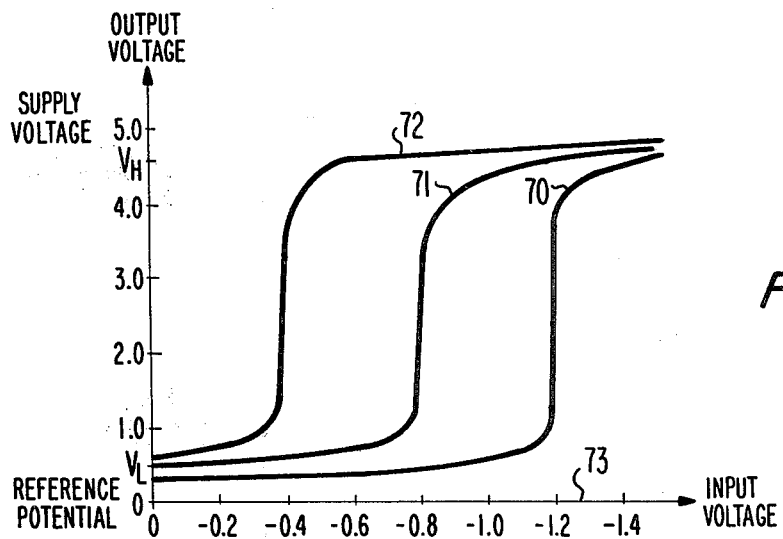
FIG. 6 is a graph of a typical A/D converter response to an input signal, for the embodiment of the circuit of FIG. 4.

The typical performance of the A/D converter of FIG. 4 having three comparators 20a, 20b and 20c is shown in FIG. 6. This is a graph of the output voltage of comparators 20a, 20b and 20c as a function of the voltage at input terminal 30d. Curve 70 is the output response of comparator 22a, curve 71 is the output response of comparator 22b, and curve 72 is the output response of comparator 22c. The output voltages for each comparator 20a, 20b and 20c are approximately equal, as indicated by the three curves 70 through 72, at the point on the abscissa 73 where the input voltage to terminal 30d is 0 volts. A first difference in the three curves 70 through 72 is the input voltage level at which the comparators 20a, 20b and 20c switch the output from a voltage, $V_L$, approximating the reference potential to the voltage, $V_H$, approximating the supply voltage. The three curves 70 through 72 illustrate that as an input signal decreases linearly from 0 volts to $-1.2$ volts the comparators will switch individually in time. The output of comparator 20c will switch from a low to high state as (curve 72) the input voltage goes below the $-0.4$ volt level. The output of the second comparator 20b will switch as (curve 71) the input voltage passes below the $-0.8$ volt level. The output of comparator 20a will switch from a low voltage to a high voltage as (curve 70) the voltage on the input node 30d decreases below $-1.2$ volts.

It can be seen that the A/D converter comprising three comparators shown in FIG. 4, and graphically described in FIGS. 5 and 6, can assume four output states. The first such state exists when the input signal at the input terminal 30d is more positive than $-0.4$ volts, and the output of the three comparators 20a, 20b and 20c are all low. The second state exists when the input potential is between −0.4 volts and −0.8 volts, and the output of comparator 20c is high and the output of comparators 20a and 20b are low. The third state exists when the input voltage is between −0.8 volts and −1.2 volts, and the outputs of comparators 20b and 20c are both high and the output of comparator 20a is low. The fourth state exists when the input potential is more negative than −1.2 volts and the outputs of the three comparators 20a, 20b and 20c are all high.

Figure 7:
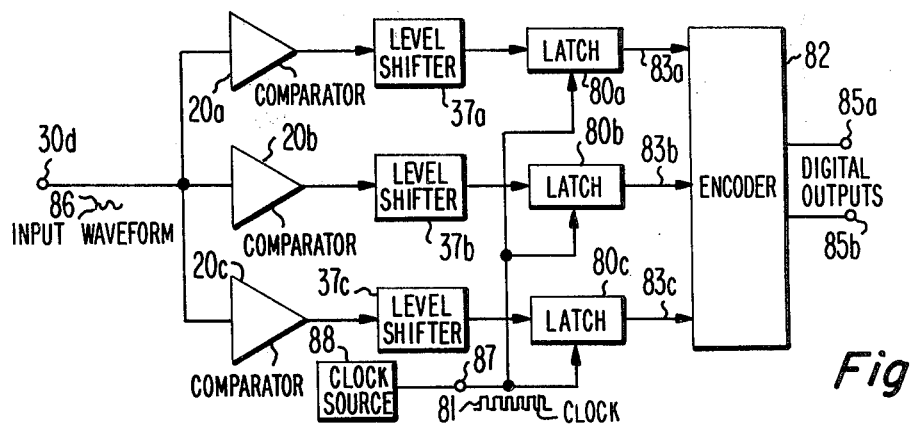
FIG. 7 is an entire signal processing system to which the embodiment of the circuit of FIG. 4 is applied.

The threshold comparators thus described can be implemented into a typical analog-to-digital signal processing system as shown in FIG. 7. The input waveform 86 is applied to terminal 30d and is fed into the three comparators 20a, 20b and 20c which are the subject of the instant invention. The outputs of the comparators 20a, 20b and 20c are applied to the level shifting circuits 37a, 37b and 37c, respectively, which produce output levels compatible with the next stage of circuitry. The level shifter outputs are applied to latches 80a, 80b and 80c which provide output signals which represent the instantaneous comparator outputs timed to the occurrences of clock pulses 81 from a clock source 88 coupled at terminal 87. The latch outputs 83a, 83b and 83c, in turn, are fed into an encoder 82 which converts the four aforementioned states of the three comparators into two binary digital outputs at terminals 85a and 85b. An encoder of this description is well known in the art. Table 1 shows how one such encoder might function. The three lines 83a, 83b and 83c into the encoder would be processed by the digital logic elements within to produce the four possible output states on the two encoder outputs 85a and 85b.

TABLE 1

| ENCODER INPUTS | | | ENCODER OUTPUTS | |
|---|---|---|---|---|
| 83a | 83b | 83c | 85a | 85b |
| 0 | 0 | 0 | 0 | 0 |
| 0 | 0 | 1 | 0 | 1 |
| 0 | 1 | 1 | 1 | 0 |
| 1 | 1 | 1 | 1 | 1 |

The A/D converter of the present embodiment has been fabricated of n-channel MESFETs on a GaAs substrate, providing high-speed operation and low power dissipation. The use of large-scale integrated (LSI) techniques also allows precise control of the process used in the fabrication of the comparator FETs within the A/D converter, specifically as regards the widths of the gate electrodes of the FETs. The widths of the gate electrode determines the conductivity of the FET; a wide gate produces an FET with a large value of saturation current, a narrower gate produces an FET with a smaller value of saturation current. Maintenance of strict control over the widths of the FET gate electrodes in the fabrication process insures that all of the switching FETs can be made with substantially the same conductivity. The saturation current levels of the load FETs can be set by varying the widths of the load FETs to known parameters so as to produce comparators with predetermined threshold levels. The present embodiment is an A/D converter comprising three comparators on a single GaAs substrate. The width of gate electrodes of each of the switching FETs 21a, 21b and 21c, as shown in FIG. 4, is 100 microns and the widths of the gate electrodes of load FETs 22a, 22b and 22c are 61, 72 and 84 microns, respectively, producing the A/D converter whose output response exhibits the characteristics depicted in FIG. 6.

The ratio of the gate width of load FET 22a to the gate width of switching FET 21a of 0.61 results in a comparator 20a with saturation current levels which establish the threshold at −1.2 volts. The ratio of the gate widths of load FET 22b and switching FET 21b of 0.72 results in a comparator 20b with saturation current levels which establish the threshold at −0.8 volts. The ratio of the gate widths of load FET 22c and switching FET 21c of 0.84 results in a comparator 20c with saturation current levels which establish the threshold at −0.4 volts.

Although the description of the invention refers to the embodiment developed by the applicant, it does not necessarily mean that the invention is limited to comparators comprising two n-channel FETs fabricated on GaAs substrates. The FETs herein described as switching FET and load FET may be any type of current conducting device with output characteristics of the type depicted in FIG. 2. The A/D converter described herein is not limited to three comparators; it may include any number where the choice is governed by the precision of measurements desired.

What is claimed is:

1. An apparatus for detecting the amplitude of an input signal relative to a predetermined threshold voltage, said apparatus comprising:

first and second field effect transistors (FET's), each having gate, source and drain electrodes;

said first FET having its gate electrode coupled to its source electrode, and having a first gate electrode width to provide with a potential across said first FET a predetermined reference load current level through said first FET establishing said predetermined threshold voltage;

said second FET having a second gate electrode width greater than said first width to thereby provide with a potential across said second FET, in response to a range of values of said input signal to said second FET gate electrode, a corresponding range of saturation current levels above and below said load current;

said first and said second FET's connected in series across a source of potential; and means for coupling said input signal to said second FET gate electrode whereby when said input signal changes from a value which produces a saturation current level through said second FET above said load current to a value which produces a saturation current level through said second FET below said load current the output level across said second FET changes.

2. The apparatus as set forth in claim 1, wherein said first FET and said second FET are gallium arsenide FET's.

3. An apparatus for converting the instantaneous amplitude of an input analog signal to a digital representation of that level, said apparatus comprising:

a plurality of voltage comparators each comprising a first and a second FET connected in series across a source of potential, each of said first FET's including a gate electrode of a first width to thereby provide a first saturation current level in response to a first value of said input signal at said gate electrode and a second different saturation current level in response to a second value of said input signal at said gate electrode, said first width of said gate electrodes being substantially identical for each of said plurality of said first FET's to thereby provide substantially identical first and second saturation current levels for each of said plurality of said first FET's;

each of said second FET's having its gate electrode coupled to its source electrode, said gate electrodes of said second FET's having a second width smaller than said first width to thereby provide predetermined reference load current levels through each of said plurality of voltage comparators between said first and said second saturation current levels, said second widths being different for each of said plurality of second FET's to thereby provide load current levels which are different for each of said plurality of second FET's; and means for coupling said input signal to each of said gate electrodes of said plurality of first FET's whereby as the voltage level of said input signal is varied between said first and said second values, the voltage level across each of said first FET's shifts between a first value and a second value at different input levels.

* * * * *